United States Patent [19]

Schlotzhauer et al.

[11] Patent Number: 4,499,386
[45] Date of Patent: Feb. 12, 1985

[54] TRIGGER CIRCUIT

[75] Inventors: Kenneth G. Schlotzhauer, Beaverton; Arthur J. Metz, Gervais, both of Oreg.

[73] Assignee: Tektronix, Inc., Beaverton, Oreg.

[21] Appl. No.: 444,764

[22] Filed: Nov. 26, 1982

[51] Int. Cl.³ .................... H03K 5/153; H03K 5/113; H03K 3/037; H03K 4/08
[52] U.S. Cl. .................. 307/260; 328/146; 328/179; 328/181; 328/187; 315/408
[58] Field of Search .............. 307/239, 228, 260, 261, 307/358, 364, 269; 315/408; 324/121 R; 328/146, 147, 179, 181, 187, 59–61, 63

[56] References Cited

U.S. PATENT DOCUMENTS

| | | | |
|---|---|---|---|
| 3,242,434 | 3/1966 | Katakami et al. | 328/181 |
| 3,358,159 | 12/1967 | Smith | 307/228 |
| 3,383,548 | 5/1968 | Goodale | 324/121 R X |
| 3,392,307 | 7/1968 | Monnier | 328/147 X |
| 3,676,707 | 7/1972 | Conrad et al. | 307/260 |
| 3,699,458 | 10/1972 | Martin et al. | 307/228 X |
| 3,725,792 | 4/1973 | Kellogg | 307/260 X |
| 3,879,669 | 4/1975 | Moriyasu | 328/187 X |
| 4,121,164 | 10/1978 | Feucht | 328/146 X |

Primary Examiner—Larry N. Anagnos
Attorney, Agent, or Firm—George T. Noe

[57] ABSTRACT

A trigger circuit including arm and trigger comparators which are responsive to the push-pull output from a differential amplifier but insensitive to its common mode component. A controllable hysteresis insertion circuit is also included in the circuit for noise rejection and sensitivity control purposes.

7 Claims, 4 Drawing Figures

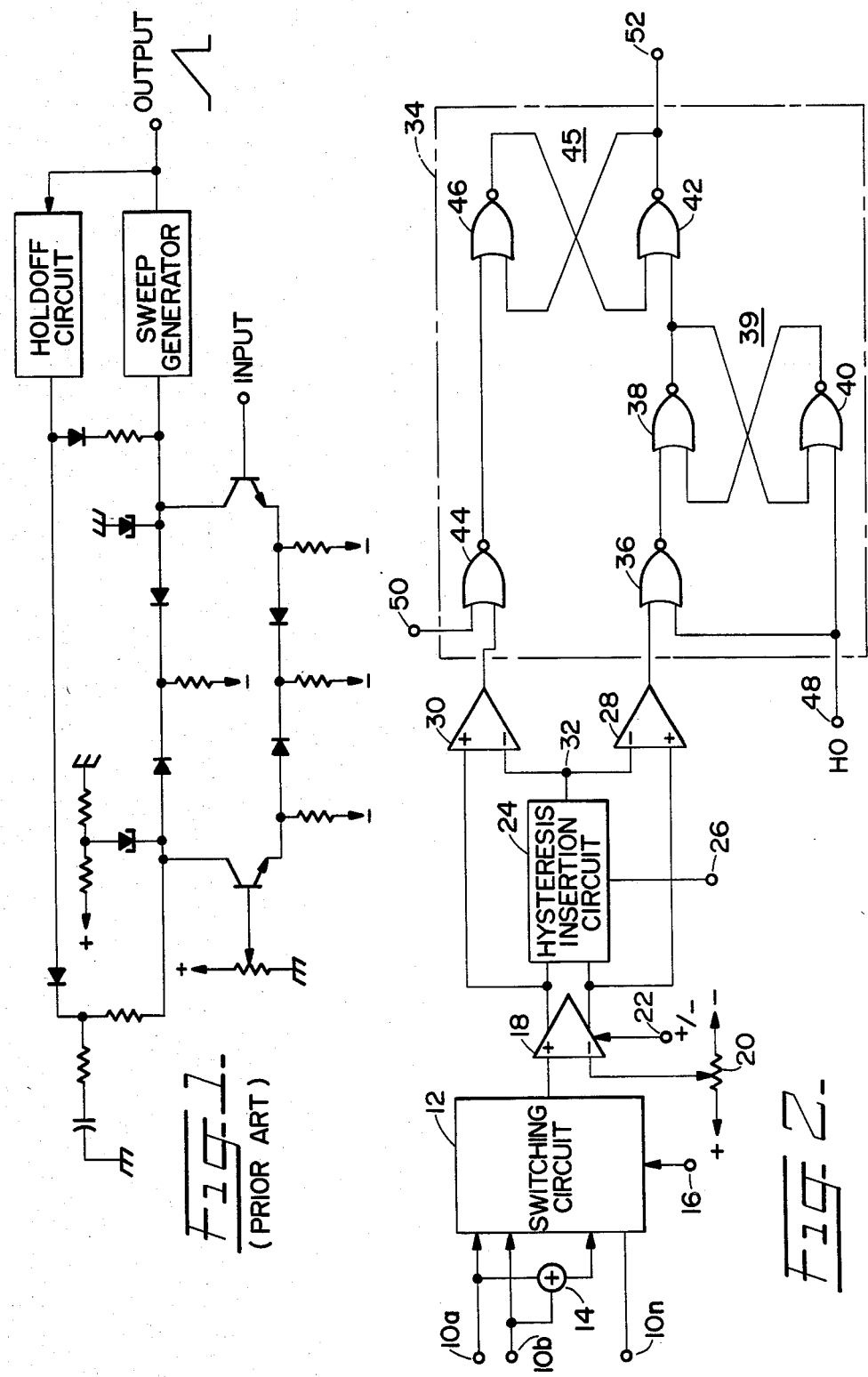

TRIGGER CIRCUIT

BACKGROUND OF THE INVENTION

This invention pertains generally to a trigger circuit, more specifically to an arm and gate type trigger circuit for oscilloscopes or various other applications.

Various types of trigger circuits have been proposed for triggering triggerable circuitry or devices such as a ramp signal generator for an oscilloscope. Trigger circuits for an oscilloscope are utilized to stably display an input signal waveform on a cathode-ray tube (CRT) screen.

Arm and gate type trigger circuits have widely been used in modern oscilloscopes. A typical prior art trigger circuit of this type is disclosed in U.S. Pat. No. 3,358,159 to Smith, one embodiment of which is shown in FIG. 1. A pair of triggerable elements, or tunnel diodes are driven by differential outputs of a differential amplifier after a hold-off period. One (arming) tunnel diode is first triggered to its high voltage stable state by one output from the differential amplifier, thereby arming the other (gating) tunnel diode. The other tunnel diode is then triggered to its high voltage stable state by the other output from the differential amplifier to initiate a ramp generator.

Disadvantages of the prior art trigger circuit include the fact that the tunnel diodes are sensitive to the common mode signal, noise, temperature variation, supply voltage fluctuations and that the hysteresis level is not controllable.

SUMMARY OF THE INVENTION

According to the present invention, a pair of comparators, (ARM and GATE comparators) are implemented in a floating configuration, thereby making the comparators insensitive to the common mode component. In addition, a hysteresis insertion circuit is employed to provide a desired hysteresis level for noise rejection and sensitivity control purposes.

It is therefore one object of the present invention to provide a common mode insensitive trigger circuit.

It is another object of the present invention to provide an improved trigger circuit having controllable hysteresis level.

It is yet another object of the present invention to provide an improved trigger comparator.

These and other objects of the present invention, as well as its operation and advantages, will be easily understood by a person skilled in the art from a reading of the following detailed description of this invention when taken in conjunction with the accompanying drawings.

BRIEF DESCRIPTION OF THE DRAWINGS

FIG. 1 is a circuit schematic of a conventional trigger circuit;

FIG. 2 is a block diagram of one embodiment of the trigger circuit according to this invention;

DETAILED DESCRIPTION OF THE PREFERRED EMBODIMENTS

Figure 3:
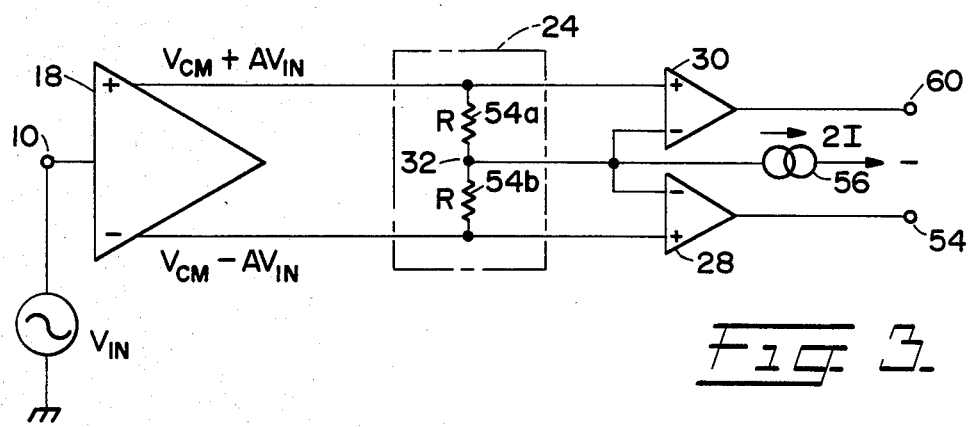
FIG. 3 is a block diagram of trigger comparator circuit according to this invention.

Referring now to FIG. 2 illustrating a block diagram of one embodiment of the present invention, a plurality of input trigger signals are applied through input terminals 10a, 10b, . . . , 10n to switching circuit 12. Adder 14 is employed to add the input signals applied to input terminals 10a and 10b together before being applied to switching circuit 12. A switch control signal is applied through control terminal 16 to switching circuit 12 for selectively coupling to the non-inverting input of amplifier 18 either input signals from input terminals 10a through 10n or signals from the output of adder 14. Switching circuit 12 may suitably be an analog switch such as that disclosed in copending application Ser. No. 415,070 filed Sept. 7, 1982. Differential amplifier 18 amplifies the trigger signal from switching circuit 12 to provide a push-pull output signal. Connected to the inverting input terminal of amplifier 18 is a trigger level control which is represented by potentiometer 20. Preferably, amplifier 18 permits its output polarity to be reversed by a polarity switching signal at control terminal 22.

The push-pull output signal from amplifier 18 is applied to the non-inverting inputs of ARM comparator 28 and GATE comparator 30. Coupled also to the push-pull output of amplifier 18 is hysteresis insertion circuit 24 to provide a controllable hysteresis, or a reference level on common node 32 for application to the inverting inputs of both comparators 28 and 30. The hysteresis level may be controlled by a control signal applied to control terminal 26. The outputs from comparators 28 and 30 are applied to logic circuit 34 which may include six NOR gates 36 through 46. A hold-off signal is applied through hold-off terminal 48 to both NOR gates 36 and 40. A delay control signal is applied through terminal 50 to NOR gate 44. NOR gates 38 and 40 are cross connected to form a first flip-flop (FF)39 and NOR gates 42 and 46 are cross connected to form a second FF 45. An overall output gate signal is available from output terminal 52 coupled to the output of NOR gate 42.

In operation, the switch control signal applied to switch control terminal 16 controls switching circuit 12 to select either one input signal. Adder 14 is used for triggering the triggerable device connected to output terminal 52 as long as an input signal is coupled to either one of terminals 10a and 10b. This circuit arrangement using adder 14 is particularly convenient because it releases an operator from the burden of selecting the proper switch control signal depending on the trigger signal(s) applied to input terminals 10a through 10n. Although adder 14 is designed in this particular embodiment to provide the sum of the two signals, more than two input signals may be added if it is desired for a certain application.

The trigger input signal selected by switching circuit 12 is then compared by comparator 18 with controllable trigger level from trigger level potentiometer 20 to provide push-pull output signals ($V_{cm}+AV_{in}$) and ($V_{cm}-AV_{in}$). Where, $V_{in}$ and $V_{cm}$ are respectively the input trigger signal and the common mode output signal component, and A represents the voltage gain of differential amplifier 18. The trigger level control signal may be applied digitally from a microprocessor ($\mu P$) or similar digital means by way of a digital-to-analog converter (DAC). The trigger level is then easily programmable to any desired level. The output polarity is, of course, reversed by switching the polarity control signal applied to control terminal 22. Hysteresis insertion circuit 24 first obtains the mean value of the push-pull output signal, or $V_{cm}$, and inserts a desired amount of DC level (hysteresis level) for hysteresis control of comparators 28 and 30. Such hysteresis level is controllable by the hysteresis control signal applied to terminal 26. The hysteresis controlled output on common node 32 is used as the reference level for comparators 28 and 30 which compare the respective input ($V_{cm}+AV_{in}$) with the reference level. The outputs from comparators 28 and 30 are normally logically high (Hi) because of the hysteresis level but rendered logically low (Lo) when the respective input signal crosses or decreases below the reference level.

Logic circuit 34 may take any conventional design but the particular embodiment operates as follows: The output from NOR gate 36 is initially Lo when either one or both of the hold-off (HO) signal and the output of ARM comparator 28 is Hi. The output of NOR gate 38 or first FF 39 is also Hi. When the output of ARM comparator 28 goes Lo after the completion of HO period (HO signal goes Lo), however, NOR gate 36 provides a Hi output which in turn causes a Lo output from first FF 39. On the other hand, the output of NOR gate 42 or second FF 45 is initially Lo but is enabled (or armed) by the Lo output from first FF 39. Similarly, the output of GATE comparator 30 is normally a Hi level. The negative transition to a Lo level causes the output of NOR gate 44 to go Hi if the delay gate pulse to terminal 50 is Lo. The positive edge of NOR gate 44 triggers NOR gate 46 to go Lo and in turn causes the already armed NOR gate 42 to go to its Hi output, thereby providing a positive output from output terminal 52.

FIG. 3 illustrates a more detailed block diagram of the hysteresis insertion and comparator sections of FIG. 2. Hysteresis insertion circuit 24 may comprise a pair of resistors 54a-54b connected in series between the two output terminals of differential amplifier 18, and a current source 56 connected to the common node 32 of resistors 54a-54b. It should be noted that resistors 54a-54b have an equal resistance R with each other, thereby developing the mean value, or only common mode component $V_{cm}$ if current source 56 is neglected for the time being. The reference level applied to the inverting inputs of ARM and TRIGGER comparators 28 and 30 therefore floats in accordance with the common mode signal component $V_{cm}$ and such comparators are responsive only to the respective signal components $\pm AV_{in}$. This means that the comparators are insensitive to time and temperature variations (drift), noise, and power supply fluctuations, thereby permitting the use of amplifiers of any conventional design as differential amplifier 18. The common mode rejection ratio (CMRR) of differential amplifier 18 is not a primary concern to the comparator circuit.

Now, the function of current source 56 will be described. Assuming that the magnitude of current source 56 is 2I, such current is split into two equal parts I which flow into resistors 54a and 54b. The current I develops voltage drop IR across each of resistors 54a and 54b. The resulting reference level to be applied to the inverting inputs of comparators 28 and 30 is ($V_{cm}-IR$). In other words, the non-inverting input voltage of comparators 28 and 30 is normally higher than the inverting input voltage thereof by the fixed amount IR under the no signal conditon and when the trigger level control 20 (in FIG. 2) is at its center zero volt position. Such hysteresis control is particularly useful to establish trigger sensitivity and also to avoid jitter due to very noisy trigger signal.

Figure 4:
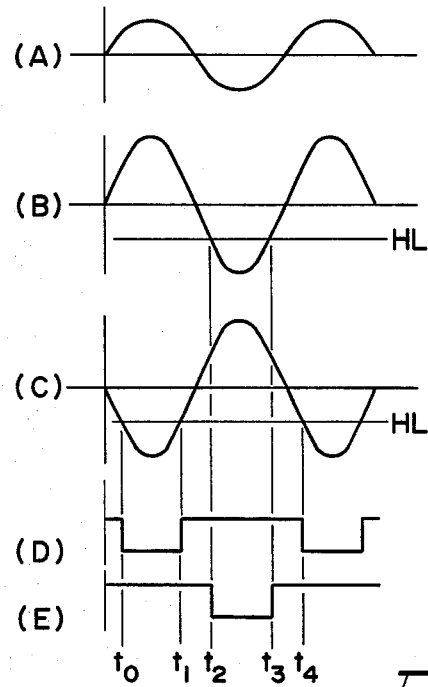
FIG. 4 is a simplified waveform diagram for explaining the operation of the circuit in FIG. 3.

Waveforms to illustrate how the circuit operates are shown in FIG. 4. The waveform (A) represents the input trigger signal $V_{in}$ which is amplified and converted into push-pull output signal waveforms $AV_{in}$ (B) and $-AV_{in}$ (C) by differential amplifier 18. ARM comparator 28 provides a Hi-to-Lo level transition at time $t_o$ when the output signal $-AV_{in}$ crosses the hysteresis level (HL) and also a Lo-to-Hi level transition at time $t_1$ (see waveform (D)). Similarly, TRIGGER comparator 30 goes to a Lo level from a Hi level at time $t_2$ and then returns to a Hi level at time $t_3$.

It is time $t_o$ that first FF 39 in FIG. 2 is triggered to arm second FF 45 and time $t_2$ that second FF 45 is finally triggered to provide the Hi output pulse available from output terminal 52. As is apparent from FIG. 4, there is a sufficient time interval ($t_o-t_2$) which is approximately equal to one-half cycle of the input signal in this particular example between the arming and triggering of second FF 45. This means that the triggerable device is triggered stably and with minimum jitter and delay.

Adder 14 of FIG. 2 is particularly useful when triggering on one trigger signal applied either one of input terminals 10a and 10b without knowing which one. Of course, an adder is also useful in such a case as triggering the circuit on the composite sync signals when vertical and horizontal sync pulses are applied to terminals 10a and 10b, respectively.

It should be noted that the foregoing description and the accompanying drawings are only for describing the invention not for limiting purposes. Many modifications may be made by those skilled in the art without departing from the broadest aspect of this invention. Consequently, the appended claims are intended to cover all such modifications.

What we claim as novel is:

1. A trigger circuit, comprising:
   a differential amplifier responsive to an input signal from an input means;
   first and second comparators to receive as one input at a first input terminal in each the push-pull output of said differential amplifier;
   a hysteresis circuit responsive to the common mode component of the push-pull output of said differential amplifier and applying a predetermined hysteresis level to be applied in common to a second input of both said first and second comparators. and
   a logic circuit responsive to the outputs of said first and second comparators from providing a trigger signal at an output terminal.

2. The trigger circuit according to claim 1 wherein said hysteresis circuit comprises a pair of resistors connected in series between the output terminals of said differential amplifier and a current source connected to the common node of said resistors.

3. The trigger circuit according to claim 2 wherein said current source is controllable.

4. The trigger circuit according to claim 1 wherein said input means including a switching circuit for selecting first and second trigger signal sources to be coupled to said differential amplifer.

5. The trigger circuit according to claim 4 wherein said switching circuit is an electronic switch.

6. The trigger circuit according to claim 4 further including an adder to add trigger signals from said first and second trigger signal sources and said switching circuit further selecting one of the first and second trigger signals and the output from said adder.

7. The trigger circuit according to claim 1 wherein said logic circuit includes first and second flip-flop circuits each responsive to the outputs of said first and second comparators.

* * * * *